United States Patent [19]

Yokoyama et al.

[11] 3,866,112

[45] Feb. 11, 1975

[54] CHANNEL SELECTING APPARATUS FOR TELEVISION RECEIVER HAVING MEANS TO CUT OFF AMPLIFYING TRANSISTOR FOR PREDETERMINED TIME

[75] Inventors: Kanji Yokoyama, Yokohama; Hiroyuki Matsuo, Fujisawa, both of Japan

[73] Assignee: Hitachi, Ltd., Tokyo, Japan

[22] Filed: Feb. 11, 1974

[21] Appl. No.: 441,355

[30] Foreign Application Priority Data

Feb. 10, 1973 Japan ............................... 48-16876

[52] U.S. Cl. ................ 334/15, 307/243, 307/252 D

[51] Int. Cl. ............................................... H03j 5/04

[58] Field of Search ........... 334/7, 15; 325/464, 465

[56] References Cited

UNITED STATES PATENTS

| | | | |
|---|---|---|---|
| 3,503,018 | 3/1970 | Cavanagh | 334/15 |
| 3,693,093 | 9/1972 | Russell | 334/15 X |
| 3,746,886 | 7/1973 | Konopka | 334/15 X |
| 3,757,260 | 9/1973 | Fujita | 334/15 |

*Primary Examiner*—Paul L. Gensler

*Attorney, Agent, or Firm*—Craig & Antonelli

[57] ABSTRACT

A channel selecting apparatus for a television receiver including channel selecting buttons, channel selecting signal amplifying transistors, switching circuits for switching the tuning voltage, voltage regulators for adjusting the voltage to be supplied to an electronic tuner, and an electronic tuner and characterized by a circuit for deriving a part of a channel selecting signal and a malfunction preventing circuit which stores the derived channel selecting signal and, after a predetermined time period, i.e., after the switching operation of the switching circuit has completed, produces a voltage sufficient for cutting off the channel selecting signal amplifying transistors which is applied to the signal amplifying transistors in a reversely biasing manner.

2 Claims, 3 Drawing Figures

CHANNEL SELECTING APPARATUS FOR TELEVISION RECEIVER HAVING MEANS TO CUT OFF AMPLIFYING TRANSISTOR FOR PREDETERMINED TIME

The present invention relates to a channel selecting apparatus for a television receiver equipped with an electronic tuner capable of selecting a desired channel only by touching a channel selecting button with a hand.

A conventionally most generally utilized tuner for a television receiver for selecting a channel having a mechanical contact mechanism is liable to give rise to a contact trouble due to the abrasion of the contact. Consequently, for improving the reliability of the receiver a non-contact tuner has been desired. Recently, an electronic tuner is becoming to be widely utilized which performs the selection of channel by utilizing a variable capacity diode in the tuning circuit and by varying the tuning frequency depending on the variation in the DC voltage applied to the tuning circuit.

However, this channel selecting apparatus has the disadvantage that if, while a channel selecting button is being touched by a hand, another channel selecting button happens also to be touched by the hand, the two channels corresponding to the buttons are alternately activated. Alternatively, if two buttons are touched by a hand simultaneously, the two channels corresponding thereto are activated simultaneously as will be described in detail below. Since these phenomena continue while the button are being touched by a hand, a normal receiving state cannot be realized during that time.

An object of the present invention is to provide a channel selecting apparatus for a television receiver utilizing an inexpensive and surely operating electronic tuner.

Another object of the present invention is to provide a channel selecting apparatus for a television receiver utilizing an electronic tuner having an error or malfunction preventing circuit of a simple circuit structure which blocks a trigger signal to a switching circuit after the operation of the switching circuit has been completed.

According to the present invention there is provided a channel selecting apparatus for a television receiver, comprising an electronic tuner for selecting a channel depending on the amount of the tuning voltage supplied to the input terminal thereof, a plurality of channel selecting buttons on which a signal is induced by being touched by a hand, a plurality of amplifying circuits each connected to each of the channel selecting buttons, a plurality of switching circuits each connected to each of the amplifying circuits, a plurality of voltage regulators each connected to the output terminal of each of the switching circuits, a plurality of reverse voltage blocking diodes each connected to the output terminal of each of the voltage regulators, means for connecting the output terminal of each of the reverse voltage blocking diodes to the input terminal of the electronic tuner, a plurality of control circuits each connected to each of the channel selecting buttons for deriving a part of the induced signal to effect control, a malfunction preventing circuit connected to all of the output terminals of the control circuits, means for connecting the output terminal of the malfunction preventing circuit to all of the amplifying circuits, a constant voltage source, and means for connecting the constant voltage source to the switching circuits and the malfunction preventing circuit, whereby the amplifying circuit and the switching circuit connected to a desired channel selecting button are activated by a signal induced on the desired channel selecting button to supply an output of the constant voltage source to the voltage regulator connected to the latter switching circuit to adjust the voltage which is supplied through the corresponding reverse voltage blocking diode to the input terminal of the electronic tuner, while the malfunction preventing circuit is activated by the induced signal supplied thereto through the corresponding control circuit to produce, after the lapse of a constant time, a voltage sufficient for cutting off the amplifying circuits which is supplied to the amplifying circuits in a reverse-biassing manner.

The above and other objects, features and advantages of the present invention will become more apparent from the following detailed description of the preferred embodiment of the present invention with a prior art for an easy understanding of the present invention when taken in conjunction with the accompanying drawings, in which.

Figure 1:
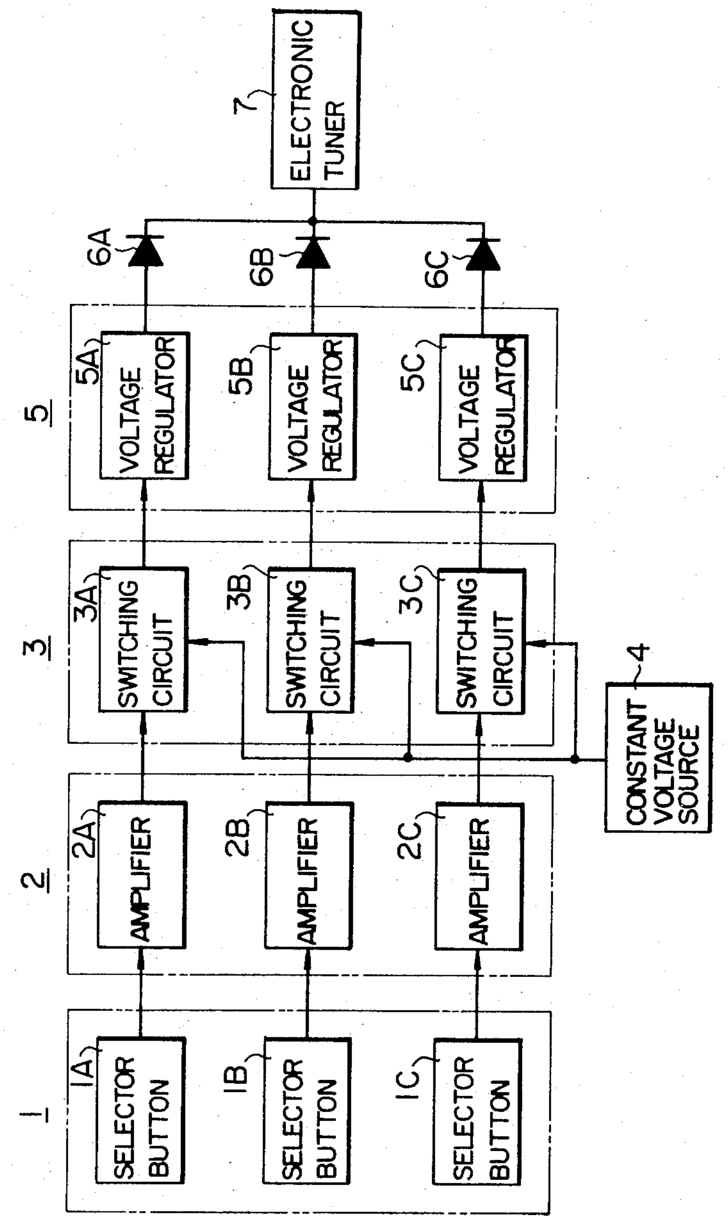
FIG. 1 PRIOR ART
FIG. 1 is a block diagram of a prior art channel selecting apparatus for a television receiver utilizing an electronic tuner.

As a preliminary description to the present invention for a better understanding of the present invention, a prior art channel selecting apparatus which selects a desired channel by utilizing a signal of the commercial power supply frequency induced in a human body will be first described referring to FIG. 1 which shows a block diagram thereof. Reference numeral 1 designates a channel selecting button section including channel selecting buttons 1A, 1B, 1C, . . . reference numeral 2 designates an amplifying section including amplifiers 2A, 2B, 2C, . . . corresponding to the selecting buttons 1A, 1B, 1C, . . . , respectively, and reference numeral 3 designates a switching circuit section including switching circuits 3A, 3B, 3C, . . . each of which is composed of, for example, a flip-flop circuit. When a signal is supplied to the switching circuits 3A, 3B, 3C, . . . through the channel selecting buttons 1A, 1B, 1C, . . . and the amplifiers 2A, 2B, 2C, . . . , the flip-flop state of the switching circuits 3A, 3B, 3C, . . . is reversed to enable a constant voltage source 4 to supply a constant voltage to a voltage regulating section 5 including voltage regulators 5A, 5B, 5C, . . . Diodes 6A, 6B, 6C, . . . are provided for preventing a voltage regulator from being supplied with a voltage from another voltage regulator. A known electronic tuner 7 selects a channel by being supplied with a voltage from any one of the voltage regulators 5A, 5B, 5C, . . .

When the channel selecting button 1A, for example, is touched by a hand, a signal of the commercial power supply frequency induced in a human body is supplied through the channel selecting button 1A to the amplifier 2A to be amplified thereby and supplied to the switching circuit 3A. Then, the switching circuit 3A is activated or, in other words, the flip-flop circuit of the switching circuit 3A is reversed to enable the constant voltage source 4 to supply a voltage to the voltage regulator 5A. Since the voltage regulated by the voltage regulator 5A is supplied to the electronic tuner 7 through the diode 6A, the channel corresponding to the channel selecting button 1A is selected.

If, in this state, another channel selecting button 1B is touched by a hand to select another channel, the signal of the commercial power supply frequency is supplied, after being amplified by the amplifier 2B, to the switching circuit 3B to activate it. When the switching circuit 3B is activated, the switching circuit 3A is turned off by the signal from the switching circuit 3B. Consequently, the voltage from the constant voltage source 4 is supplied solely to the voltage regulator 5B and, after being regulated thereby, to the electronic tuner 7 through the diode 6B to enable the tuner 7 to select the channel corresponding to the channel selecting button 1B.

However, since the arrangement of FIG. 1 is of the circuit construction having the switching circuit section 3 operated by the signal amplified by the amplifying section 2, the switching circuit section 3 is kept supplied with a trigger signal throughout the time period during which the amplifying section 2 is supplied with the signal of the commercial power supply frequency, that is, throughout the time period during which the channel selecting button section 1 is touched by a hand. As a result, when, while the channel selecting button 1A, for example, is being touched by a hand, also the channel selecting button 1B, for example, happens to be touched by the hand, the switching circuit 3A is once turned off by the signal from the switching circuit 3B. However, since the switching circuit 3A is kept supplied with the trigger signal, the switching circuit 3A is again turned on and the switching circuit 3B is turned off. In this manner the switching circuits 3A and 3B are turned on and off alternately. Also, when the channel selecting buttons 1A and 1B are touched by a hand simultaneously, both switching circuits 3A and 3B turn on simultaneously.

An embodiment of the arrangement according to the present invention will now be described referring to FIG. 2. Similarly to the arrangement of FIG. 1 the arrangement of FIG. 2 also has a channel selecting button section 8 including channel selecting buttons 8A, 8B, 8C, . . . , an amplifying section 9 including amplifiers 9A, 9B, 9C, . . . a switching circuit section 10 including switching circuits 10A, 10B, and 10C, . . . , a voltage regulating section 11 including voltage regulators 11A, 11B, 11C, . . . , reverse voltage blocking diodes 12A, 12B, 12C, . . . , an electronic tuner 13, and a constant voltage source 14.

Figure 2:
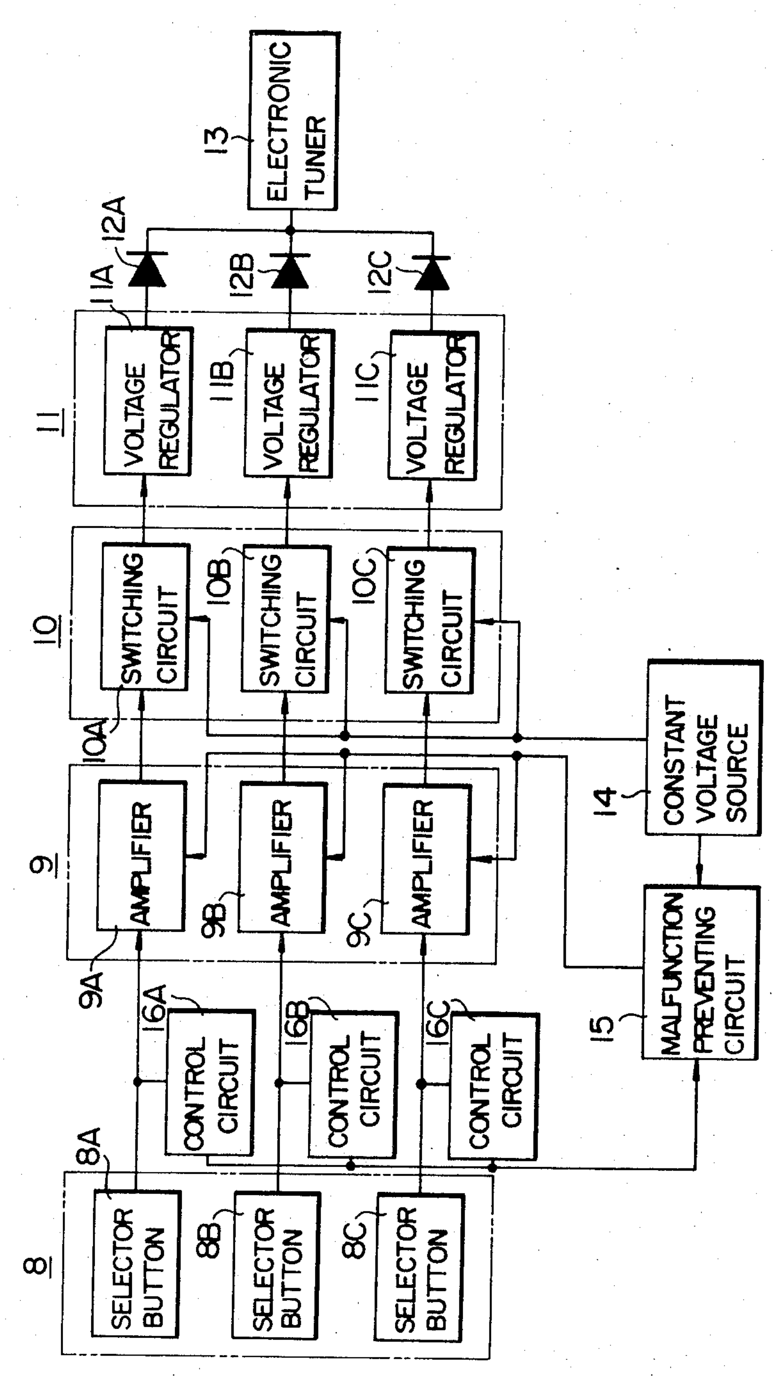
FIG. 2 is a block diagram of a channel selecting apparatus for a television receiver utilizing an electronic tuner according to the present invention.

The arrangement of FIG. 2 is further provided with a malfunction preventing circuit 15 and control circuits 16A, 16B, 16C, . . . for controlling the malfunction preventing circuit 15. An input terminal of the malfunctioning preventing circuit 15 is connected to the control circuits 16A, 16B, 16C, . . . , and the output terminal thereof is connected to the amplifiers 9A, 9B, 9C, . . . The malfunctioning preventing circuit 15 is provided to cut off the amplifiers 9A, 9B, 9C, . . . after the completion of the operation of the switching circuits 10A, 10B, 10C, . . .

The operation of the arrangement of FIG. 2 except for the malfunctioning preventing circuit 15 and the control circuits 16A, 16B, 16C, . . . characteristic of the present invention, that is, the operation of the arrangement of FIG. 2 when only one channel selecting button is touched by a hand is similar to that of the arrangement of FIG. 1, and hence a description thereof is not repeated here. However, thanks to the malfunction preventing circuit 15 and the control circuits 16A, 16B, 16C, . . . the operation of the arrangement of FIG. 2 when two channel selecting buttons are touched by a hand is quite different from that of the arrangement of FIG. 1.

As an example, the operation of the arrangement of FIG. 2 when the channel selecting button 8B is also touched by a hand while the channel selecting button 8A is being touched by the hand will be described.

Since the channel selecting button 8A is touched by a hand, the amplifier 9A, the switching circuit 10A, etc. are activated to select the channel corresponding to the channel selecting button 8A. On the other hand, the commercial frequency voltage induced on the channel selecting button 8A is also supplied to the malfunction preventing circuit 15 through the control circuit 16A. Then, the malfunctioning preventing circuit 15 is activated to generate a malfunctioning preventing signal on its output after the lapse of a constant time. By this signal the amplifiers 9A, 9B, 9C, . . . are cut off. As a result, even if the channel selecting buttons 8B, 8C, . . . are touched by a hand, the switching circuits 10B, 10C, . . . corresponding to the channel selecting buttons 8B, 8C, . . . are never activated nor the switching circuit 10A corresponding to the channel selecting button 8A firstly touched by the hand is turned off.

Figure 3:
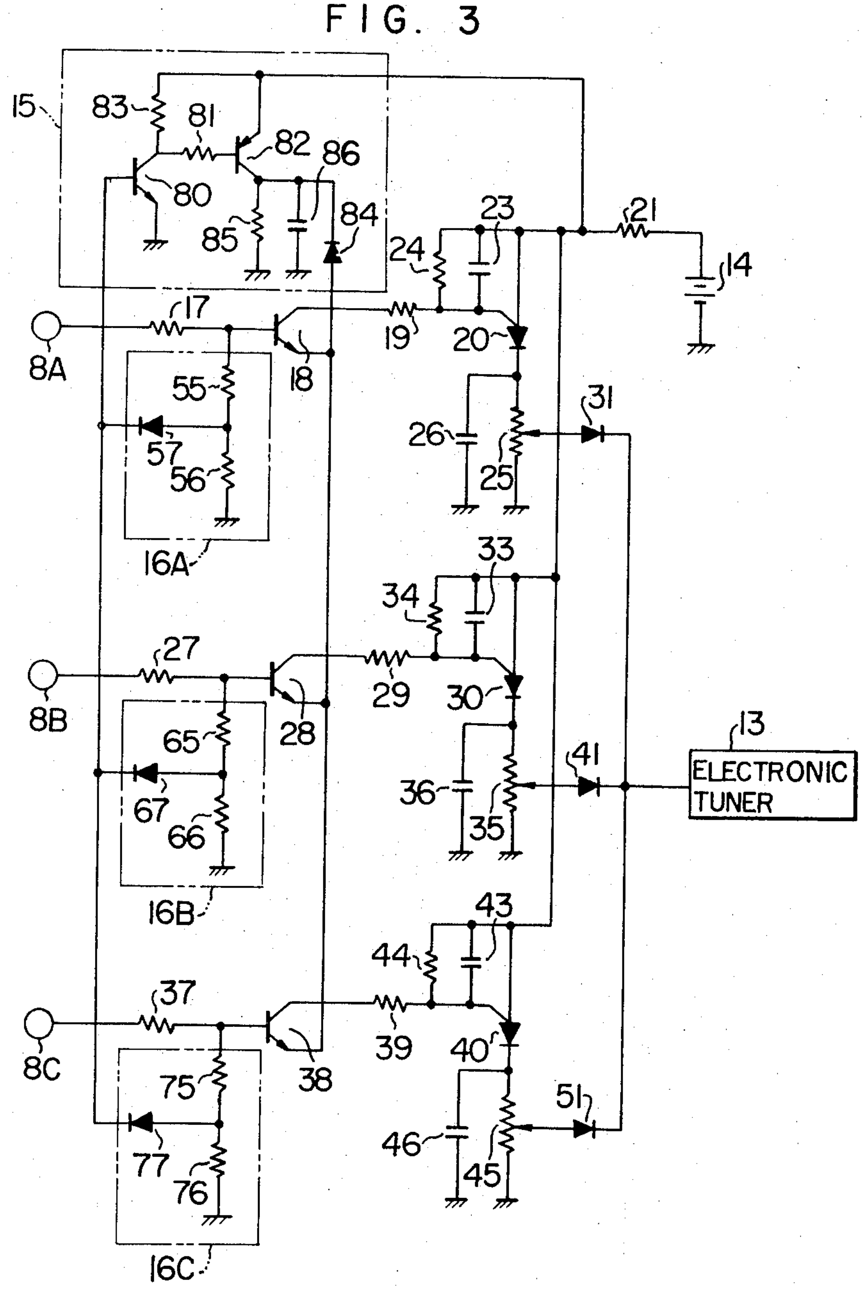
FIG. 3 is a materialized circuit diagram of an embodiment of the channel selecting apparatus according to the present invention.

FIG. 3 is a practical circuit diagram of an embodiment of the present invention. Channel selecting buttons 8A, 8B, 8C, . . . on which a voltage of the commercial power supply frequency is induced by being touched by a hand through the capacity and the conductive resistance of a human body are connected to the bases of channel selecting signal amplifying transistors 18, 28, 38, . . . through resistors 17, 27, 37, . . . , respectively. The collectors of the channel selecting signal amplifying transistors 18, 28, 39, . . . are connected to the gates of N-gate thyristors 20, 30, 40, . . . through bias resistors 19, 29, 39, . . . , respectively, and the emitters of the transistors 18, 28, 38, . . . are connected in common. The anodes of the N-gate thyristors 20, 30, 40, . . . are connected in common and connected to a constant voltage source 14 through a resistor 21. To the gates of the thyristors 20, 30, 40, . . . are connected capacitors 23, 33, 43, . . . and resistors 24, 34, 44, . . . for preventing the malfunctioning of the thyristors, respectively. The cathodes of the thyristors are grounded through variable resistors, 25, 35, 45, . . . to which capacitors 26, 36, 46, . . . are connected in parallel, respectively. The slide terminals of the variable resistors 25, 35, 45, . . . are connected in common through first reverse voltage blocking diodes 31, 41, 51, . . . , respectively, and connected to an electronic tuner 13.

To the channel selecting buttons 8A, 8B, 8C, . . . are also connected control circuits 16A, 16B, 16C, . . . consisting of voltage dividing resistors 55, 65, 75, . . . and 56, 66, 76, . . . and second reverse voltage blocking diodes 57, 67, 77, . . . connected to the junction points of the voltage dividing resistors 55, 65, 75, . . . and 56, 66, 76, . . . , respectively. The cathodes of the second reverse voltage blocking diodes 57, 67, 77, . . . are connected in common and connected to the base of a signal detecting transistor 80 of a malfunctioning preventing circuit 15. The emitter of the signal detecting transistor 80 is grounded directly, and the collector thereof is connected to the base of a signal inverting transistor 82 through a resistor 81 and at the same time connected to the constant voltage source through a bias resistor 83. The emitter of the signal inverting transistor 82 is connected to the constant voltage source 14, and the collector thereof is connected to the emitters of the signal amplifying transistors 18, 28, 38, . . . through a third reverse voltage blocking diode 84 and at the same time is grounded through a discharging resistor 85 to which an operating time setting capacitor 86 is connected in parallel.

The malfunctioning preventing circuit 15 is to reverse-bias all the signal amplifying transistors 18, 28, 38, . . . to cut off the operation thereof after the lapse of a time sufficient for the switching circuit corresponding to the channel selecting button touched by the hand to complete its switching operation. For this purpose it is sufficient to select the value of the bias resistance such that the growing voltage produced across the operating time setting capacitor 86 becomes higher than the base voltage of the signal amplifying transistor.

When no channel selecting button is touched by a hand, no signal is supplied to the signal amplifying transistors 18, 28, 38, . . . to put the N-gate thyristors 20, 30, 40, . . . in a cut-off state.

Now, if a hand touches the channel selecting button 8A, a voltage of the commercial power supply frequency is induced on the channel selecting button 8A through the capacity and the conductive resistance of the human body and supplied to the base of the channel selecting signal amplifying transistor 18 through the protecting resistor 17. Consequently, the transistor 18 becomes conductive during the positive half cycle of the commercial power supply frequency, so that the gate voltage of the N-gate thyristor 20 becomes lower than the anode voltage to be turned on. Thus, the output of the constant voltage source 14 is supplied to the variable resistor 25 and the capacitor 26 through the thyristor 20. Since the variable resistor 25 is adjusted such that a predetermined voltage is produced on its slider when the variable resistor 25 is supplied with the voltage from the constant voltage source 14, a predetermined tuning voltage is supplied to the electronic tuner 13 through the reverse voltage blocking diode 31. Consequently, the channel corresponding to the channel selecting button 8A, i.e., a desired channel is selected. If the thyristor 20 once becomes conductive, it keeps the ON state due to its self sustaining property even if the hand is detached from the channel selecting button 8A.

Next, if in this state a hand touches the channel selecting button 8B to select the channel corresponding thereto, the signal is supplied through the signal amplifying transistor 28 to the gate of the N-gate thyristor 30 to turn the thyristor 30 on. Since the current flowing through the N-gate thyristor 30 at the moment the thyristor 30 is turned on flows through the resistor 21, the N-gate thyristor 30 and the capacitor 36, the current flowing through the resistor 21 is doubled, so that the voltage drop is also doubled. On the other hand, since the charge stored in the capacitor 26 on the cathode side of the N-gate thyristor 20 cannot be discharged rapidly, the N-gate thyristor 20 is reversely biassed by the voltage drop due to the resistor 21 and by the charge stored in the capacitor 26 to be cut off. Consequently, the current flowing through the N-gate thyristor 30 at the moment it is turned on flows through the variable resistor 35 in the stationary state, so that a predetermined voltage can be derived from the slider of the variable resistor 35. Consequently, the tuning voltage supplied to the electronic tuner 13 is switched from the one due to the variable resistor 25 to the one due to the variable resistor 35 to select the channel corresponding to the channel selecting button 8B.

In a quite similar manner, when the channel selecting button 8C is touched by a hand, the channel corresponding to the channel selecting button 8C can be selected.

Next, a description will be made of the case in which a plurality of channel selecting buttons are touched by a hand, for example the case in which in the state that the channel selecting button 8A is touched by a hand the channel selecting button 8B is also touched by the hand in addition thereto.

First, when the channel selecting button 8A is touched by a hand, the signal is supplied to the base of the amplifying transistor 18, and at the same time a part of the signal induced on the channel selecting button 8A is divided by the voltage dividing resistors 55 and 56 and then supplied through the reverse voltage blocking diode 57 to the base of the signal detecting transistor 80 in the malfunctioning preventing circuit 15 to turn on the signal detecting transistor 80. This signal is further amplified by the signal inverting transistor 82 so that the voltage is applied to the discharging resistor 85 and the operating time setting capacitor 86 connected to the collector of the transistor 82. Then, the collector voltage of the signal inverting transistor 82 grows at the rate determined by the collector current flowing through the transistor 82 and the capacity of the operating time setting capacitor 86.

Consequently, the signal amplifying transistor 18 is turned on only at the moment the channel selecting button is touched by the hand to supply the signal to the N-gate thyristor 20 to turn it on. Thereafter the signal amplifying transistor 18 is cut off by the growing voltage stored in the operating time setting capacitor 86 in the malfunctioning preventing circuit 15 after the lapse of a predetermined time. This state continues throughout the time period during which the channel selecting button 8A is touched by the hand. Also all the signal amplifying transistors 18, 28, 38, . . . are cut off because their emitters are connected in common. Consequently, even if the channel selecting button 8B is also touched by the hand in the state that the channel selecting button 8A is touched by the hand, the channel selecting signal amplifying transistor 28 corresponding to the channel selecting button 8B is not turned on. Thus, the N-gate thyristor 30 is supplied with no signal, so that it remains in the ON state. This situation stands similarly also for the case in which the channel selecting button 8C is touched by the hand.

As described above, according to the present invention, when the channel selecting button is touched by the hand, the channel selecting signal amplifying transistor is activated to supply a sufficiently intense trigger signal to the switching circuit and the malfunction preventing circuit is activated after the completion of the switching operation to cut off all the channel selecting signal amplifying transistors. Since the latter state continues until the channel selecting signal has no longer been supplied, that is, until the hand has been detached from the channel selecting button, even if two or more channel selecting buttons are touched by the hand, neither all of them are turned on nor they are alternately turned on and off like the multivibrator. Thus, a very good quality channel selecting apparatus with a simple structure can be provided inexpensively.

What we claim is:

1. A channel selecting apparatus for a television receiver, comprising an electronic tuner for selecting a channel depending on the amount of the tuning voltage supplied to the input terminal thereof, a plurality of channel selecting buttons on which a signal is induced by being touched by a hand, a plurality of amplifying circuits each connected to each of the channel selecting buttons, a plurality of switching circuits each connected to each of the amplifying circuits, a plurality of voltage regulators each connected to the output terminal of each of the switching circuits, a plurality of reverse voltage blocking diodes each connected to the output terminal of each of the voltage regulators, means for connecting the output terminal of each of the reverse voltage blocking diodes to the input terminal of the electronic tuner, a plurality of control circuits each connected to each of the channel selecting buttons for deriving a part of the induced signal to effect control, a malfunction preventing circuit connected to all of the output terminals of the control circuits, means for connecting the output terminal of the malfunction preventing circuit to all of the amplifying circuits, a constant voltage source, and means for connecting the constant voltage sources to the switching circuits and the malfunction preventing circuit, whereby the amplifying circuit and the switching circuit connected to a desired channel selecting button are activated by a signal induced on the desired channel selecting button to supply an output of the constant voltage source to the voltage regulator connected to the latter switching circuit to adjust the voltage which is supplied through the corresponding reverse voltage blocking diode to the input terminal of the electronic tuner, while the malfunction preventing circuit is activated by the induced signal supplied thereto through the corresponding control circuit to produce, after the lapse of a constant time, a voltage sufficient for cutting off the amplifying circuits which is supplied to the amplifying circuits in a reverse-biassing manner.

2. A channel selecting apparatus for a television receiver, comprising an electronic tuner for selecting a channel depending on the amount of the tuning voltage supplied to the input terminal thereof, a plurality of channel selecting buttons, a plurality of signal amplifying transistors connected to the plurality of channel selecting buttons whose emitters are connected in common, a plurality of switching elements whose control terminals are connected to the output terminals of the signal amplifying transistors, respectively, whose input terminals are connected to a common resistor, and whose output terminals are connected with capacitors, respectively, a constant voltage source connected to the input terminals of the switching elements through the common resistor, a plurality of voltage regulators connected to the output terminals of the switching elements, respectively, a plurality of first reverse voltage blocking diodes connected to the voltage regulators, respectively, and to the electronic tuner, the signal amplifying transistor and the switching element connected to a desired channel selecting button being turned on by a signal supplied to the desired channel selecting button, the output of the constant voltage source being supplied to the input terminal of the electronic tuner through the latter switching element, the voltage regulator connected thereto, and the first reverse voltage blocking diode connected thereto, a plurality of second reverse voltage blocking diodes whose anodes are connected to the bases of the signal amplifying transistors, respectively, and whose cathodes are connected in common, a first transistor operating by being supplied with a signal at its base from said commonly connected cathodes, a second transistor connected to the output terminal of the first transistor and to whose collector a discharging resistor and an operating time setting capacitor are connected, and a third reverse voltage blocking diode connected between the common emitter of the signal amplifying transistors and the collector of the second transistor, whereby a voltage sufficient for cutting off the signal amplifying transistors is produced after the lapse of a constant time determined by the collector current of the second transistor and the operating time setting capacitor and is supplied to the signal amplifying transistors in a reverse-biassing manner.

* * * * *